US008335331B2

(12) United States Patent
Johnston et al.

(10) Patent No.: US 8,335,331 B2

(45) Date of Patent: Dec. 18, 2012

(54) MULTICHANNEL SOUND RENDERING VIA VIRTUALIZATION IN A STEREO LOUDSPEAKER SYSTEM

(75) Inventors: James D. Johnston, Redmond, WA (US); Qunli Li, Woodinville, WA (US); Serge Smirnov, Redmond, WA (US)

(73) Assignee: Microsoft Corporation, Redmond, WA (US)

(*) Notice: Subject to any disclaimer, the term of this patent is extended or adjusted under 35 U.S.C. 154(b) by 1131 days.

(21) Appl. No.: 12/016,944

(22) Filed: Jan. 18, 2008

(65) Prior Publication Data

US 2009/0185693 A1 Jul. 23, 2009

(51) Int. Cl.
*H03G 3/00* (2006.01)
*H04R 5/02* (2006.01)

(52) U.S. Cl. ............................ 381/307; 381/61; 381/63

(58) Field of Classification Search .................. 381/310, 381/61, 63, 307

See application file for complete search history.

(56) References Cited

U.S. PATENT DOCUMENTS 5,371,799 A * 12/1994 Lowe et al. ................... 381/310
5,440,639 A * 8/1995 Suzuki et al. ................... 381/17
5,822,437 A * 10/1998 Winterer ........................... 381/1
6,016,295 A * 1/2000 Endoh et al. ............... 369/47.16
6,175,631 B1 1/2001 Davis et al.
6,195,434 B1 * 2/2001 Cashion et al. ................. 381/17
6,700,980 B1 * 3/2004 Hamalainen et al. ........... 381/17
6,944,309 B2 * 9/2005 Terai et al. .................... 381/309
7,024,259 B1 * 4/2006 Sporer et al. .................... 700/94
7,027,601 B1 * 4/2006 Johnston ......................... 381/56
7,123,731 B2 10/2006 Cohen et al.
2004/0136538 A1 7/2004 Cohen et al.
2005/0053249 A1 3/2005 Wu et al.
2005/0069143 A1 3/2005 Budnikov et al.
2005/0100171 A1 5/2005 Reilly et al.
2005/0117762 A1 6/2005 Sakurai et al.
2005/0135643 A1 * 6/2005 Lee et al. ...................... 381/309
2005/0265558 A1 12/2005 Neoran
2005/0271214 A1 12/2005 Kim
2006/0115091 A1 * 6/2006 Kim et al. ....................... 381/18
2006/0212147 A1 * 9/2006 McGrath et al. ................ 700/94
2006/0274900 A1 * 12/2006 Griesinger ...................... 381/10

OTHER PUBLICATIONS

Kraemer, "Two Speakers Are Better Than 5.1," *IEEE Spectrum*, May 2001, pp. 71-74.

Naef et al., "Spatialized Audio Rendering for Immersive Virtual Environments," *Proceedings of the ACM Symposium on Virtual Reality Software and Technology*, 2002, 8 pages.

Okamoto et al., "THPM 16.3 Sound Image Rendering System for Headphones," *IEEE*, 1997, pp. 298-299.

* cited by examiner

*Primary Examiner* — Elvin G Enad
*Assistant Examiner* — Alexander Talpalatski
(74) *Attorney, Agent, or Firm* — Klarquist Sparkman, LLP

(57) ABSTRACT

A speaker virtualization system provides virtual surround sound using a pair of physical loudspeakers. A multiple surround audio channels input is processed using a combination of head related transfer functions and shaped reverberation to provide widening and front/back auditory clues without requiring any kind of interaural path cancellation. The system uses a 360 degree power-response head related transfer function to provide perceptual separation of the reverberant and direct paths, along with discrete, different reverberation for left and right rendering channels to provide envelopment. By eliminating interaural path cancellation, the speaker virtualization system also produces a wider virtual surround sound effect, without dependency on head position and facing.

21 Claims, 8 Drawing Sheets

300

400

500

600

700

MULTICHANNEL SOUND RENDERING VIA VIRTUALIZATION IN A STEREO LOUDSPEAKER SYSTEM

BACKGROUND

A typical surround sound home audio system uses multiple speakers driven with separate audio channels to create a "surround sound" listening experience. The most prevalent system currently is a 5.1 channel surround system that requires five speakers for left, center, right, surround left, and surround right channels, as well as a subwoofer for low frequency environmental effects (LFE). With proper placement of the speakers in front and in back of the listener (i.e., to the listener's front left, front center, front right, rear left and rear right), these systems create the sensation of being surrounded by the sound of a movie, music performance or other desired audio environment. However, the multiple speakers used by these systems make them over complicated for most home users to set up and configure properly. In particular, it is difficult and expensive to unobtrusively position and wire speakers in front and behind the listening position (chairs or couch) of a home theatre. These systems are further complicated by a need to conduct setup testing to adjust the speaker placement and amplifier balance to achieve the best surround sound listening experience.

Virtual surround systems use sound localization techniques to produce the sensation of a full surround sound field using a simple stereo pair of speakers. These sound localization techniques map the surround sound channels (e.g., the 5.1 surround channels) into a virtual space, creating the perception of sound sources (the missing speakers) to the sides and behind the listener without actual physical speakers positioned there. One approach to virtually localizing sound sources uses filtering with a head related transfer function (HRTF). An HRTF models the frequency response of the human head and ear as a function of the source direction. When the HRTF-based approach is used with speakers, it typically requires careful crosstalk cancellation to achieve good localization precision. Virtual surround systems therefore have used interaural path cancellation (also called interaural crosstalk cancellation) together with the HRTF processing. The interaural path cancellation attempts to isolate sounds intended for the left ear to the left speaker, and sound to the right ear from the right speaker. A drawback to this HRTF-based approach with interaural path cancellation, however, is that it generally produces a very narrow "sweet spot" where the virtualization effect can properly be heard. In other words, the virtual surround sound effect can be destroyed if the listener turns his or her head, or moves slightly away from the sweet spot. The listener thus is required to sit in a very specific position in the room, and maintain a head position directly toward the center of the two loudspeakers.

SUMMARY

The following Detailed Description concerns various techniques and apparatus that provide virtual surround sound using a pair of physical loudspeakers. The techniques use a combination of head related transfer functions and shaped reverberation to provide widening and front/back auditory clues without requiring any kind of interaural path cancellation. This combination can provide a good sensation of front/back and left/right directionality, and envelopment. By eliminating the interaural path cancellation, the technique can be implemented in a simpler (lower computational power) device. With the interaural path cancellation eliminated, the listening area where the virtual surround sound effect can be perceived is much wider. Further, the effect is not dependent on head position or the direction that the listener faces.

According to a first aspect, the technique uses a combination of head related transfer functions, including a 360 degree power-response head related transfer function, to provide perceptual separation of the reverberant and direct paths.

According to a further aspect, the technique uses different, discrete reverberation for left and right rendering channels. This decorrelates the reverberation rendered to the left and right channels, which provides envelopment.

This Summary is provided to introduce a selection of concepts in a simplified form that is further described below in the Detailed Description. This summary is not intended to identify key features or essential features of the claimed subject matter, nor is it intended to be used as an aid in determining the scope of the claimed subject matter. Additional features and advantages of the invention will be made apparent from the following detailed description of embodiments that proceeds with reference to the accompanying drawings.

DETAILED DESCRIPTION

The following detailed description concerns various techniques and systems for speaker virtualization. The speaker virtualization techniques are illustrated in the context of their particular application to audio systems suitable for home and other like small listening areas, to provide a surround experience from as few as a pair of loudspeakers. The techniques can also be applied in other sound virtualization applications.

More particularly, the speaker virtualization systems and techniques use a combination of head related transfer functions and shaped reverberation to provide widening and front/back auditory clues without requiring interaural path cancellation. As compared to virtual surround techniques based on interaural path cancellation, the speaker virtualization systems and techniques described herein can provide a wider listening area and surround effect that is not dependent on head position or direction that the listener is facing.

The various techniques and tools described herein may be used independently. Some of the techniques and tools may be used in combination. Various techniques are described below with reference to flowcharts of processing acts. The various processing acts shown in the flowcharts may be consolidated into fewer acts or separated into more acts. For the sake of simplicity, the relation of acts shown in a particular flowchart to acts described elsewhere is often not shown. In many cases, the acts in a flowchart can be reordered.

I. Overview

Figure 1:
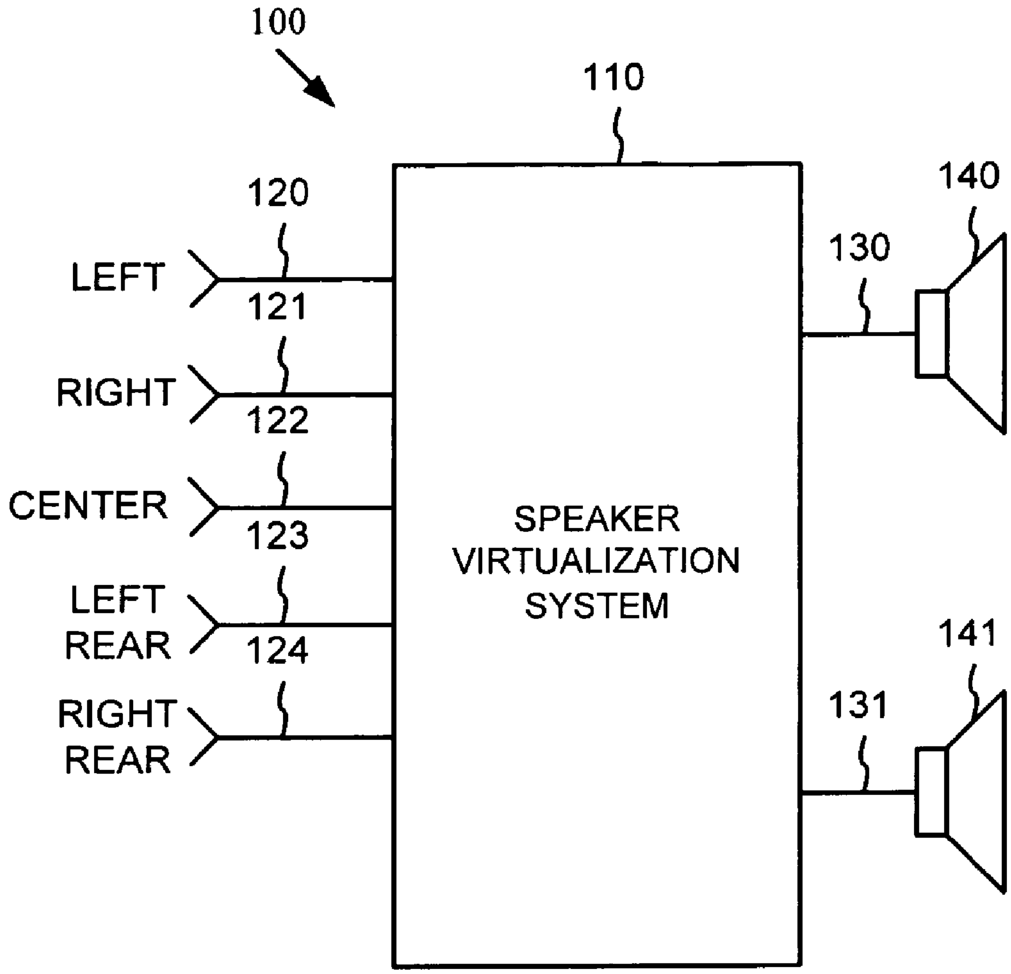
FIG. 1 is a block diagram illustrating a speaker virtualization system according to one embodiment of the invention.

With reference to FIG. 1, a speaker virtualization system 100 has inputs 120-124 to receive a multiple channel audio signal, such as the left, center, right, surround left and surround right channels of a 5 channel surround signal. In alternative implementations, the system can include fewer or more channels, such as an LFE channel of a 5.1 channel surround signal. The speaker virtualization system 100 processes the input channels using a combination of head-related transfer functions and shaped reverberation as described more fully below to produce output channels 130-131 for a pair of loudspeakers 140-141 that provides an auditory sensation of the input channels being played from virtual speakers around the listener. In other words, the perception of surround sound from a stereo loudspeaker pair.

The speaker virtualization system 100 uses a combination of head-related transfer functions, including a 360 degree power-response HRTF to provide perceptual separation between reverberant and direct paths. Further, the speaker virtualization system uses different, discrete reverberation for the two output channels, so as to decorrelate the reverberation rendered via the two output channels to create a sensation of envelopment. This provides widening and front/back auditory clues without having interaural path cancellation. The speaker virtualization system 100 therefore can produce the virtual surround effect in a wider listening area, which is independent of the listener's head position and facing.

II. Detailed Explanation of Virtual Surround Processing

Figure 2:
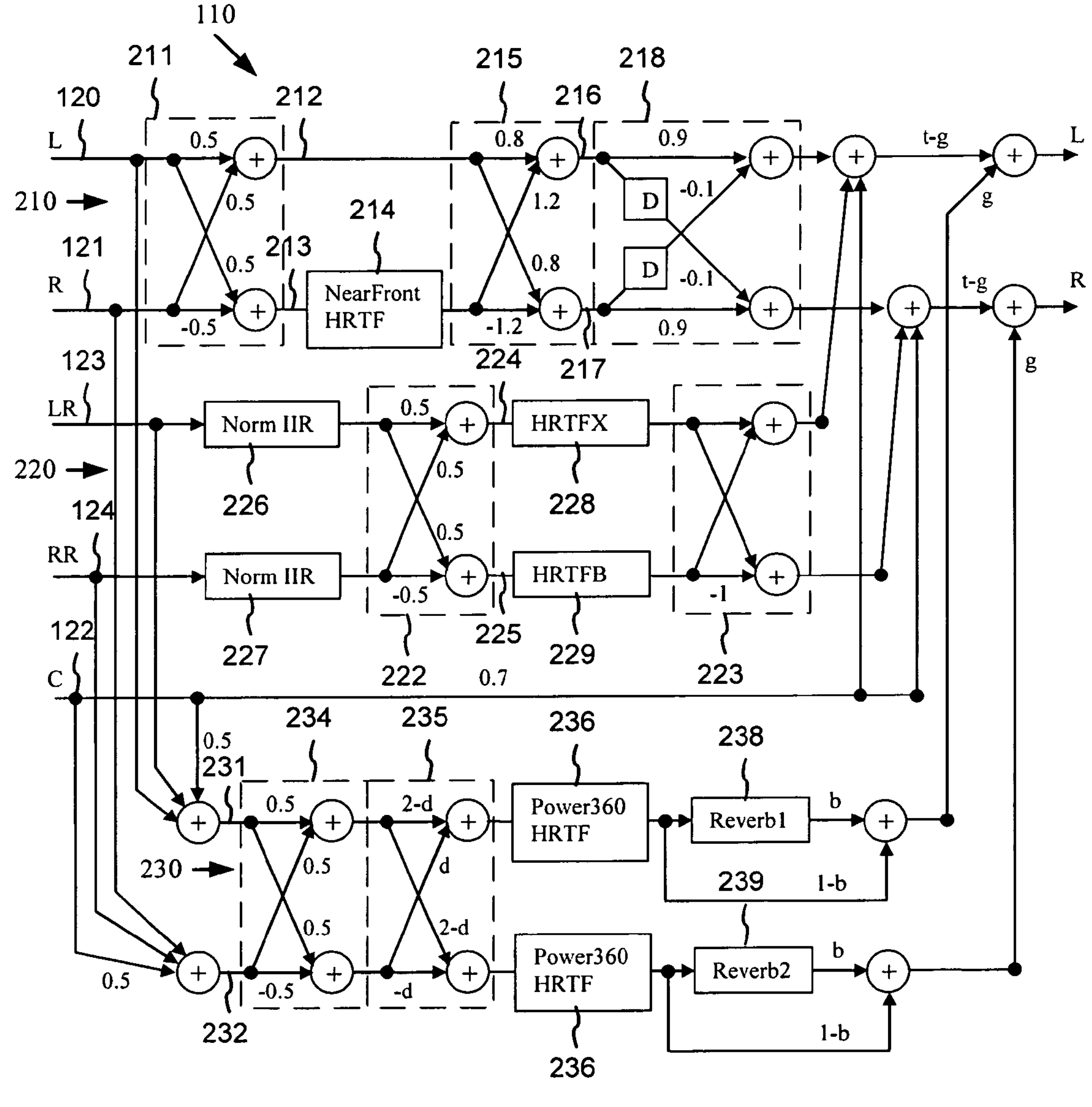
FIG. 2 is a flow diagram illustrating processing of multiple surround channels in the speaker virtualization system of FIG. 1 to produce a virtual surround sound effect with two physical loudspeaker channels.

With reference to FIG. 2, the speaker virtualization system 100 includes separate processing paths for front channels and rear channels, as well as a diffuse sound processing path. More particularly, each of the left and right output channels 130, 131 is produced from a combination of a front channels processing path 210, a rear channels processing path 220 and a separate diffuse sound processing path 230.

The processing path 210 for the front channels includes several stages. In a first sum and difference processing stage 211, the processing path scales the left and right input channels 120, 121 by half, and produces the sum 212 and difference 213 of the scaled input channels. The front channels processing path 210 then applies a "near-front" head related transfer function (HRTF) 214 to the difference signal 213. This is followed by a second sum and difference processing stage 215, where the difference signal 213 is scaled up by a factor of 1.2 while the sum signal 212 is scaled down by a scaling factor equal to 0.8. This results in left and right channel signals 216, 217. Finally, a last processing stage 218 of the front channels processing path 210 subtracts the right channel signal with a delay (D) and scaling by 0.1 from the left channel (scaled by 0.9), and vice-versa. In a representative implementation, this delay can be 0.1 milliseconds, which relates to an assumed arrival time difference between the listener's ears from the two front loudspeakers 140, 141. The effect of the near front HRTF and sum and difference stages is to produce the sensation of the left and right virtual speakers from the two loudspeakers 140, 141, and to widen the listening area in which this effect can be perceived.

Figure 3:
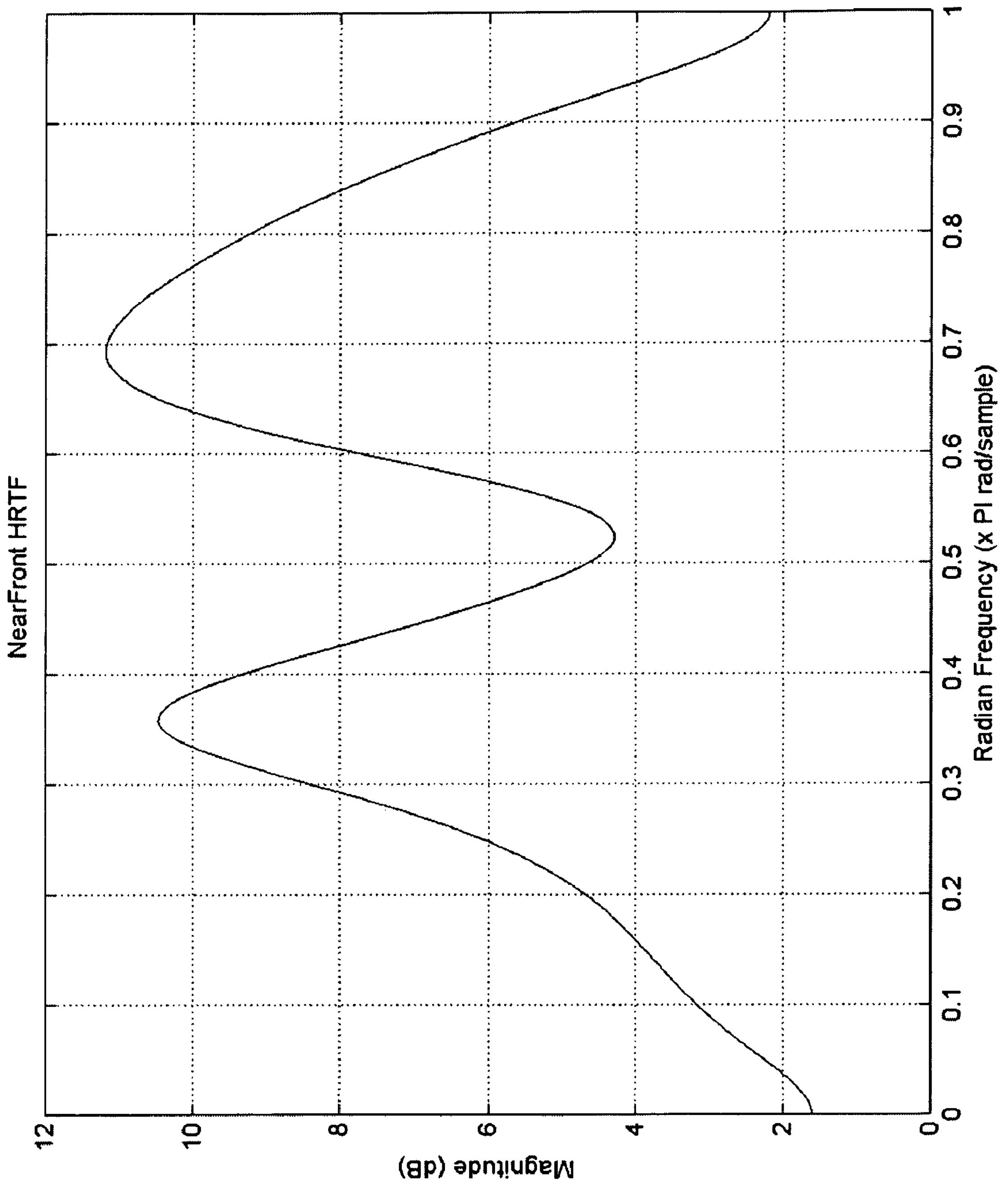
FIG. 3 is a graph of a frequency response curve for a head related transfer function applied to front channels of the multiple surround channels during processing by the speaker virtualization system as shown in FIG. 2.

A plot 300 of an exemplary function that can be used as the near front HRTF 214 in the front channels processing path 210 is shown in FIG. 3. The near front HRTF 214 represents the response of the right ear to sound from the right front direction, or in other words, the ear's response to same side loudspeaker. The plot shows the response in decibels relative to radian frequency. In practice, the HRTF is implemented as an infinite impulse response (IIR) filter, using a programmed digital signal processor (DSP).

Figure 4:
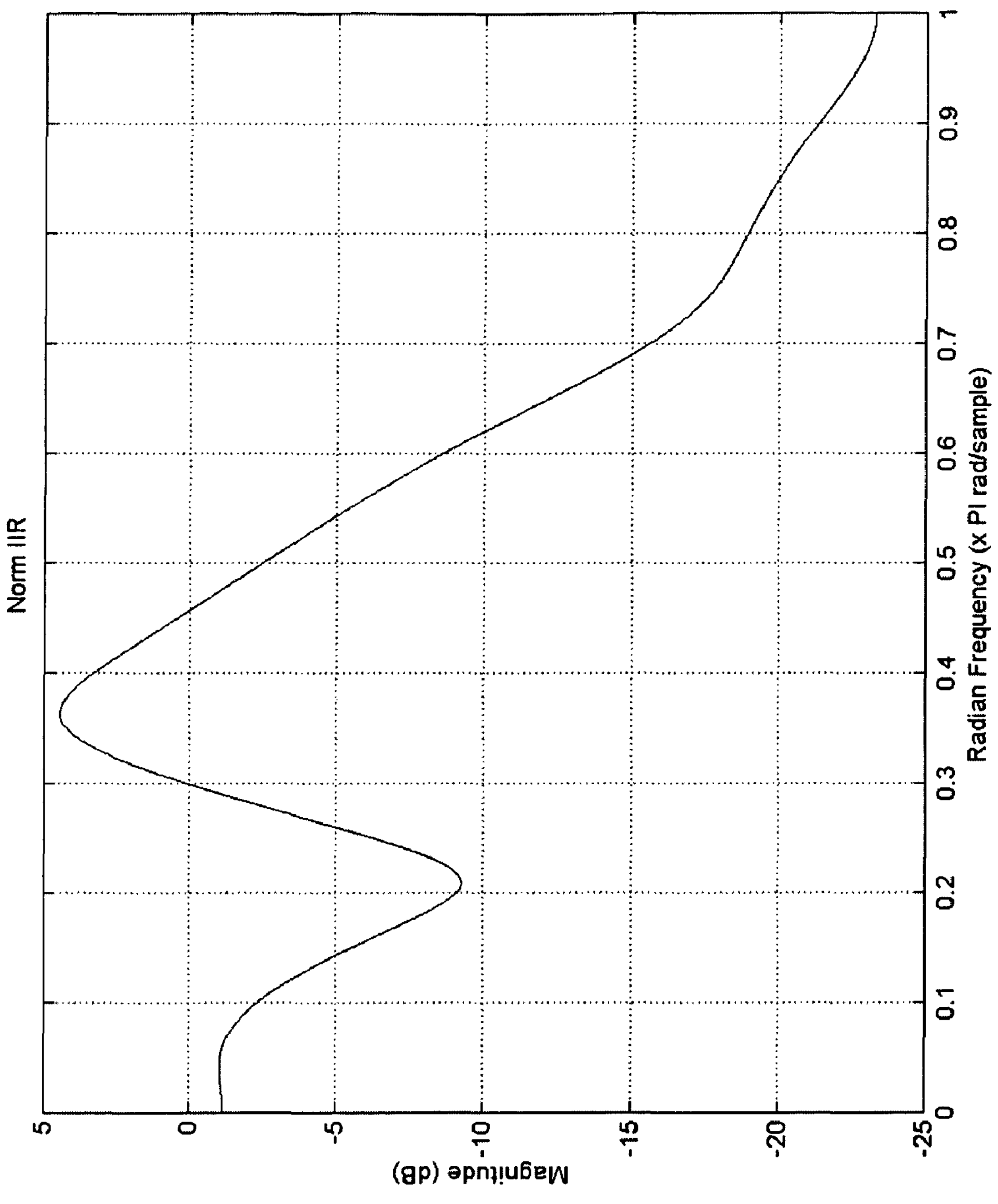
FIG. 4 is a graph of a frequency response curve for a normalizing filter applied in a processing path for rear channels of the multiple surround channels by the speaker virtualization system as shown in FIG. 2.

With reference again to FIG. 2, the processing path 220 for the rear channels 123, 124 also includes two sum and difference stages 222, 223. Prior to the first sum and difference stage 222, the rear channels processing path 220 applies a normalizing filter. In one implementation, the normalizing filter is derived from a near back HRTF ($F_1$) and far back HRTF ($F_2$) by the equation $\sqrt{F_1F_2}$. In the illustrated implementation, the filtering stage applied to the left and right rear channels are implemented as infinite impulse response (IIR) filters 226, 227. FIG. 4 illustrates a plot of magnitude (in decibels) as a function of radian frequency of a representative IIR suitable for use as the filtering stage in the rear channels processing path. This representative IIR filter has poles and zeroes listed as follows:

a_Norm_IIR=[% denominator (poles) 1.0000000000000000e+000, −1.6888094727864102e+000, 1.4837366524370064e+000, −8.5601030412333767e−001, 3.1768188713232198e−001, −1.9813914299408908e−001, 9.6933754378490042e−002];

b_Norm_IIR=[% numerator (zeros) 3.6843438710213988e−001, −1.9483915898255028e−001, −1.6684962978085230e−001, 7.5848874550809561e−002, 1.3679340931697379e−001, −6.8813369749838255e−003, −7.6482207859333587e−002];

Between the sum and difference stages 222, 223 in the rear channels processing path 220, two head related transfer functions (HRTFX and HRTFB) are applied to the sum and difference signals 224, 225. These head related transfer functions are derived from the near back HRTF ($F_1$) and far back HRTF ($F_2$), which relate to the ear's response to a loudspeaker placed near and farther behind the listener. More particularly, HRTFX is equal to the relation of near back and far back HRTFs by the equation $$\left(\frac{F_2}{\sqrt{F_1F_2}}\right),$$

whereas HRTFB is given by the equation $$\left(\frac{F_1}{\sqrt{F_1F_2}}\right).$$

Figure 5:
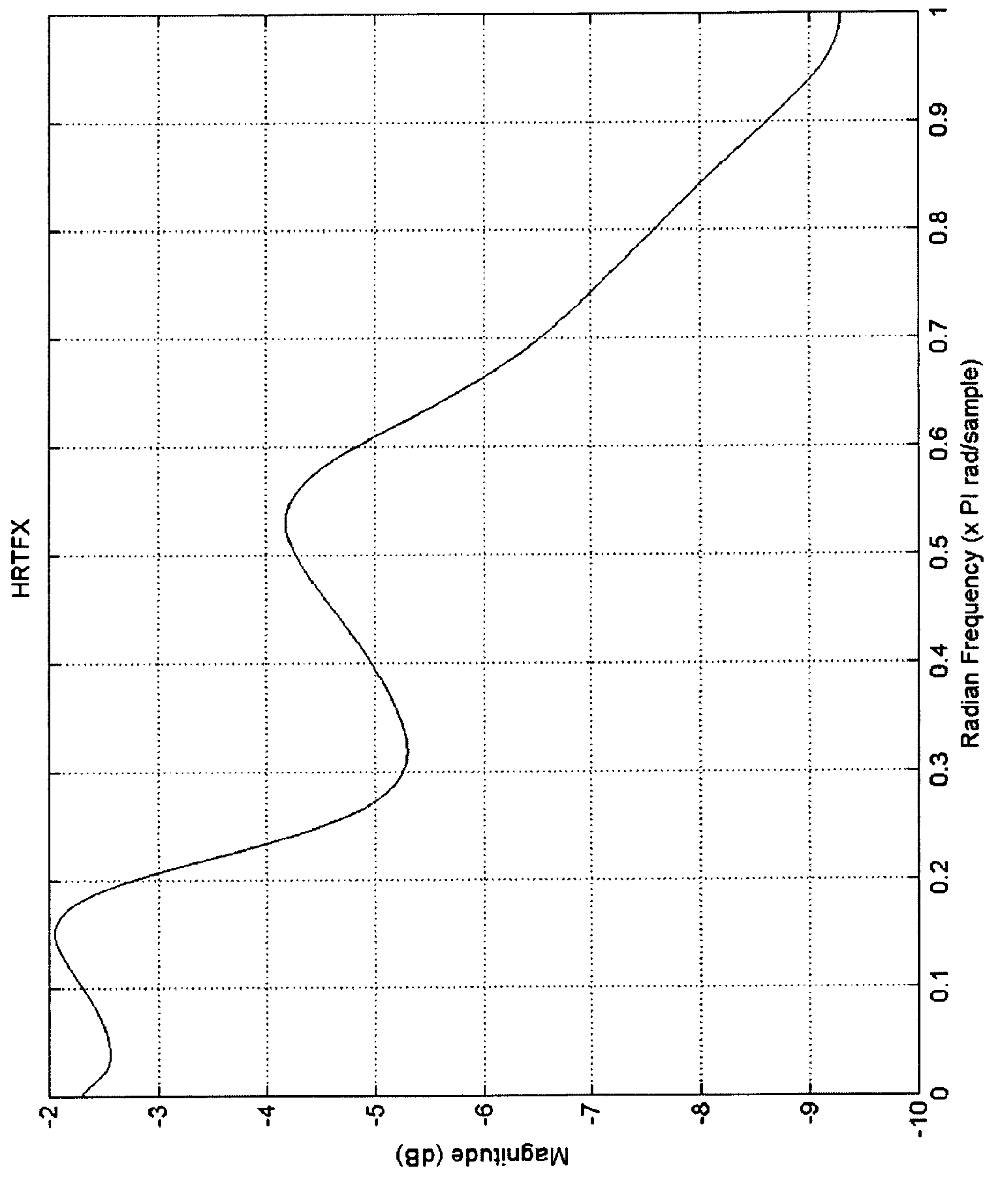
FIG. 5 is a graph of a frequency response curve for a normalized, far back head related transfer function applied in a processing path for rear channels of the multiple surround channels by the speaker virtualization system as shown in FIG. 2.
Figure 6:
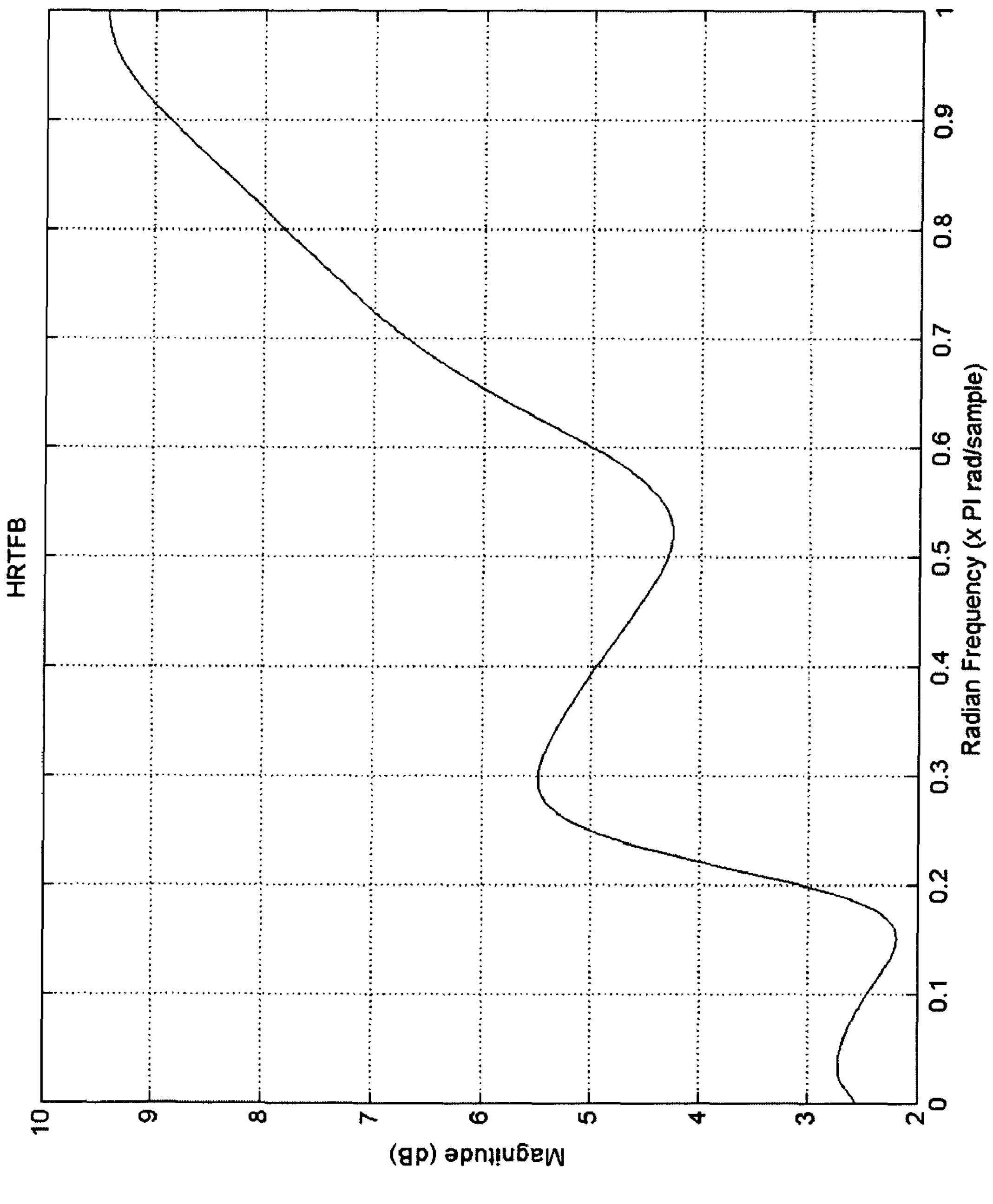
FIG. 6 is a graph of a frequency response curve for a normalized, near back head related transfer function applied in a processing path for rear channels of the multiple surround channels by the speaker virtualization system as shown in FIG. 2.

FIGS. 5 and 6 illustrate plots 500, 600 of response magnitude as a function of radian frequency for representative implementations of the HRTFX and HRTFB functions. The HRTFX and HRTFB is derived from empirical testing of human hearing, and may differ in other implementations of the speaker virtualization system. In this representative implementation, the HRTFX and HRTFB are implemented by impulse response filters having the poles and zeroes listed as follows:

a_HRTFB=[% denominator (poles) 1.0000000000000000e+000, −1.2570479899538574e+000, 4.2424536096528470e−001, −5.6087980625149664e−002, 4.2392917282740181e−002, 3.6752820157085697e−002, −1.2973307456470098e−001];

b_HRTFB=[% numerator (zeros) 1.8804327858095968e+000, −2.9676273667211244e+000, 1.7595091989408038e+000, −8.5895832371487202e−001, 4.9389363159725336e−001, −3.2762684986932166e−003, −2.2262689556048482e−001];

a_HRTFX=[% denominator (poles) 1.0000000000000000e+000, −1.4497763400048707e+000, 7.3484019001267709e−001, −3.4482752398561028e−001, 1.9311090365472569e−001, 5.0039045207491264e−002, −1.3383200293258363e−001];

b_HRTFX=[% numerator (zeros) 5.4275222551622471e−001, −6.1273613225000345e−001, 1.4823063002225800e−001, −9.9574656128668497e−003, 7.1240749882067042e−003, 3.4183062814524288e−002, −7.1560061721450768e−002];

In the diffuse sound processing path 230, the input left channel 120, left rear channel 123 and center channel 122 (scaled by half) are combined (summed) into a left signal path 231. The input right channel 121, right rear channel 124 and center channel 122 (scaled by half) also are combined (summed) into a right signal path 232. The diffuse sound processing path 230 then includes a pair of sum and difference stages 234, 235. The first sum and difference stage 234 produces a sum and difference of the left and right signal paths 231, 232 (scaled by half). The second sum and difference stage 235 recombines the sum and difference signals produced by the first sum and difference stage 234 to reconstruct left and right signal paths. However, the sum and difference signals are scaled in this second sum and difference stage 235 according to a widening/narrowing parameter (d). More specifically, the sum signal is scaled by a factor (2−d), while the difference signal is scaled by (d) as shown in FIG. 2. The widening/narrowing parameter (d) can be varied or tuned to provide a desired widening (for d>1) or narrowing (for d<1) of the stereo channels. A suitable value of the parameter can be chosen for a given application. Alternatively, an implementation of the stereo virtualization system can provide a user interface control or setting to permit end user "tuning" of the parameter.

Figure 7:
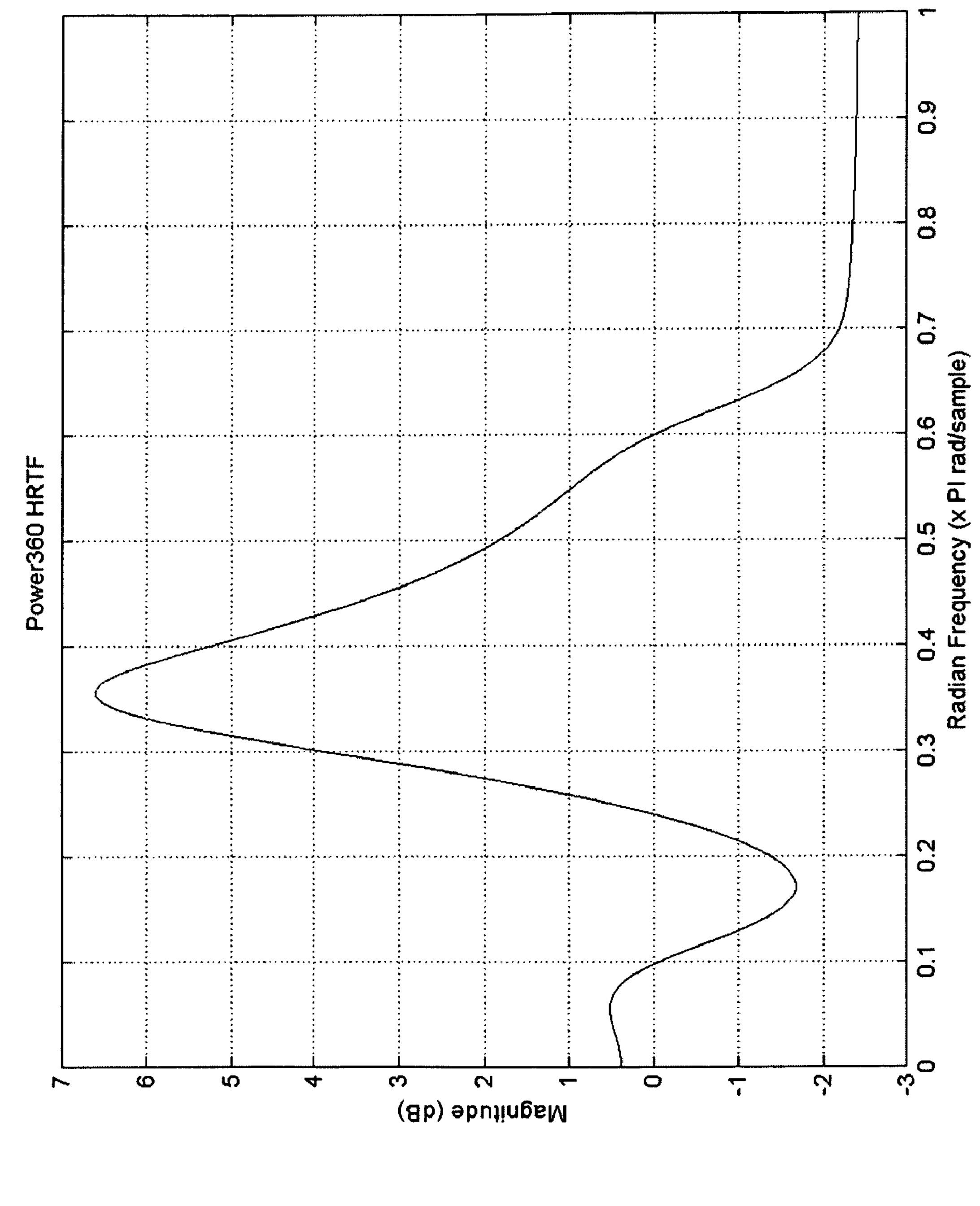
FIG. 7 is a graph of a frequency response curve for a 360 degree power-response head related transfer function applied during processing of the multiple surround channels by the speaker virtualization system as shown in FIG. 2.

Following the sum and difference stages 234, 235, the diffuse sound processing path 230 applies a power 360 degree HRTF 236 to each of the left and right signals. The power 360 degree HRTF 236 represents the ear's response to a diffuse sound field surrounding the listener. FIG. 7 illustrates a plot 700 of response magnitude as a function of radian frequency for a representative implementation of the power 360 degree HRTF 236. The power 360 degree HRTF is derived from empirical testing of human hearing, and may differ in other implementations of the speaker virtualization system. The power 360 degree HRTF can be implemented as an IIR filter.

The diffuse sound processing path 230 also include separate reverberation 238, 239 applied to the left and right signals. The diffuse sound processing path 230 applies a different, discrete reverberation to each of the left and right signals, which serves to decorrelate the reverberation in these signals from each other and provide envelopment or diffuse sound effect. The amount of reverberation applied is based on a reverberation strength parameter (b). The reverberation path of the left and right signals is scaled by the reverberation strength parameter as shown in FIG. 2. Similar to the widening/narrowing parameter (d), an appropriate value of the reverberation strength parameter (b) can be chosen for a given application, or alternatively a user interface control or setting for the reverberation strength parameter can permit end user "tuning."

The left and right signals from the front channels processing path, the rear channels processing path and the diffuse sound processing path are combined to form the left and right rendering channels 130, 131 to be output to the loudspeakers 140, 141 (FIG. 1). The left and right signals from the front channels processing path and rear channels processing path are first summed with the center channel (with scaling by a factor of 0.7). The resulting combination of left and right signals from the front and rear processing paths are then combined with the left and right signals from the diffuse sound processing path. For this latter combination, the left and right signals are scaled by two parameters, a gain (g) of the diffuse sound path and output scale (t). In one representative implementation, the gain (g) is a value from 0 to 0.2. In an example implementation, the output scale (t) is a value chosen from between 1 to 1.15. The output scale parameter in other implementations need not be constrained to this range, and can be greater or less depending on other design considerations of the implementation (such as input signal scale, numeric formats, digital-analog conversion behavior, analog gain, etc.). In some implementations, the gain and output scale parameters can be fixed value chosen as appropriate for the intended application. Alternatively, the parameters may be exposed via a user interface control or setting for variably tuning by the end user.

In an alternative implementation, the gains for the direct and diffuse sound (reverbed) paths can be expressed as t*(1−g) and t*g, respectively. This alternative parameterization decouples the reverberation weight parameter g from the output scale parameter.

It should be recognized that there exist various numerically equivalent operations that may be used to achieve similar results as the above described signal processing operations. It should be understood therefore that reference herein to these signal processing operations of the speaker virtualization system includes implementations using such numerically equivalent operations.

IV. Computing Environment

Figure 8:
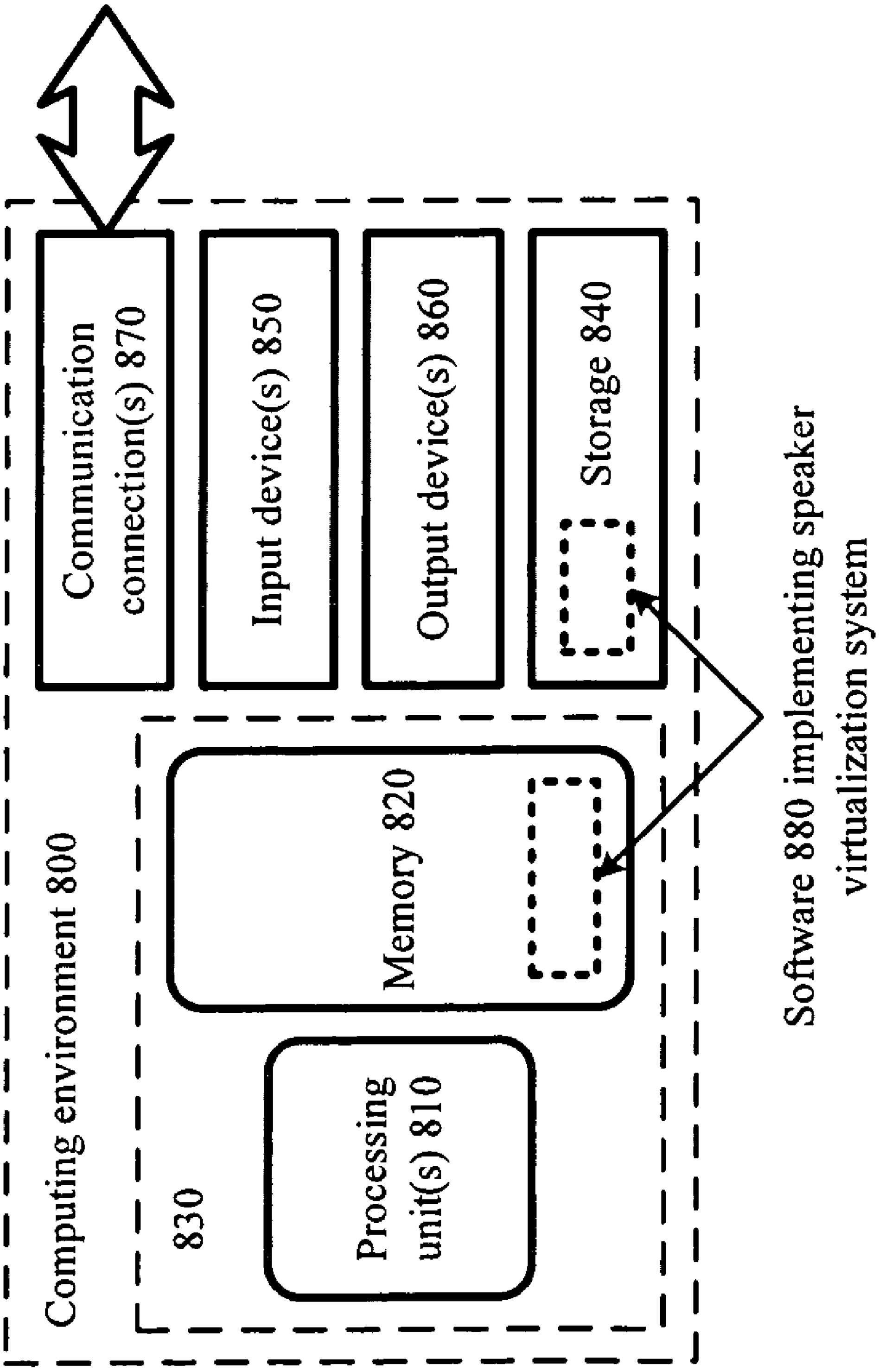
FIG. 8 is a block diagram of a generalized operating environment in conjunction with which various described embodiments may be implemented.

The speaker virtualization system 100 shown in FIG. 1 can be implemented as dedicated audio processing equipment, such as using a digital signal processor programmed to perform the processing illustrated in FIG. 2 by firmware or software. Alternatively, the system can be implemented using a general purpose computer with suitable programming to perform the processing illustrated in FIG. 2 using a digital signal processor on a sound card, or even the central processing unit of the computer to perform the digital audio signal processing. FIG. 8 illustrates a generalized example of a suitable computing environment 800 in which the speaker virtualization system 100 may be implemented on a general purpose computer. The computing environment 800 is not intended to suggest any limitation as to scope of use or functionality, as described embodiments may be implemented in diverse general-purpose or special-purpose computing environments, as well as dedicated audio processing equipment.

With reference to FIG. 8, the computing environment 800 includes at least one processing unit 810 and memory 820. In FIG. 8, this most basic configuration 830 is included within a dashed line. The processing unit 810 executes computer-executable instructions and may be a real or a virtual processor. In a multi-processing system, multiple processing units execute computer-executable instructions to increase processing power. The processing unit also can comprise a central processing unit and co-processors, and/or dedicated or special purpose processing units (e.g., an audio processor or digital signal processor, such as on a sound card). The memory 820 may be volatile memory (e.g., registers, cache, RAM), non-volatile memory (e.g., ROM, EEPROM, flash memory), or some combination of the two. The memory 820 stores software 880 implementing one or more audio processing techniques and/or systems according to one or more of the described embodiments.

A computing environment may have additional features. For example, the computing environment 800 includes storage 840, one or more input devices 850, one or more output devices 860, and one or more communication connections 870. An interconnection mechanism (not shown) such as a bus, controller, or network interconnects the components of the computing environment 800. Typically, operating system software (not shown) provides an operating environment for software executing in the computing environment 800 and coordinates activities of the components of the computing environment 800.

The storage 840 may be removable or non-removable, and includes magnetic disks, magnetic tapes or cassettes, CDs, DVDs, or any other medium which can be used to store information and which can be accessed within the computing environment 800. The storage 840 stores instructions for the software 880.

The input device(s) 850 may be a touch input device such as a keyboard, mouse, pen, touchscreen or trackball, a voice input device, a scanning device, or another device that provides input to the computing environment 800. For audio or video, the input device(s) 850 may be a microphone, sound card, video card, TV tuner card, or similar device that accepts audio or video input in analog or digital form, or a CD or DVD that reads audio or video samples into the computing environment. The output device(s) 860 may be a display, printer, speaker, CD/DVD-writer, network adapter, or another device that provides output from the computing environment 800.

The communication connection(s) 870 enable communication over a communication medium to one or more other computing entities. The communication medium conveys information such as computer-executable instructions, audio or video information, or other data in a data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

Embodiments can be described in the general context of computer-readable media. Computer-readable media are any available media that can be accessed within a computing environment. By way of example, and not limitation, with the computing environment 800, computer-readable media include memory 820, storage 840, and combinations of any of the above.

Embodiments can be described in the general context of computer-executable instructions, such as those included in program modules, being executed in a computing environment on a target real or virtual processor. Generally, program modules include routines, programs, libraries, objects, classes, components, data structures, etc. that perform particular tasks or implement particular data types. The functionality of the program modules may be combined or split between program modules as desired in various embodiments. Computer-executable instructions for program modules may be executed within a local or distributed computing environment.

For the sake of presentation, the detailed description uses terms like "determine," "receive," and "perform" to describe computer operations in a computing environment. These terms are high-level abstractions for operations performed by a computer, and should not be confused with acts performed by a human being. The actual computer operations corresponding to these terms vary depending on implementation.

In view of the many possible embodiments to which the principles of our invention may be applied, we claim as our invention all such embodiments as may come within the scope and spirit of the following claims and equivalents thereto.

We claim:

1. A method of processing multiple surround audio channels to produce left and right rendering channels for output to a stereo pair of loudspeakers, wherein the multiple surround audio channels comprise at least left and right channels and left rear and right rear channels, the method comprising:

processing the left and right channels in a direct sound processing path;

processing the left and right channels in a diffuse sound processing path;

processing the left rear and right rear channels in a rear channels processing path;

in the diffuse sound processing path:

applying a power 360 degree head related transfer function associated with listener diffuse sound field response;

combining left and left rear channels into a combined left channel;

combining right and right rear channels into a combined right channel;

applying a first reverberation to the combined left channel; and applying a second reverberation to the combined right channel, wherein the second reverberation differs from the first reverberation.

2. The method of claim 1 wherein the multiple surround audio channels further comprise a center channel, and the method further comprises:

further combining the center channel with the left and left rear channels into the combined left channel; and further combining the center channel with the right and right rear channels into the combined right channel.

3. The method of claim 1, comprising, in the diffuse sound processing path:

scaling the first reverberation applied to the combined left channels according to a variable reverberation amount parameter; and scaling the second reverberation applied to the combined right channels according to the variable reverberation amount parameter, whereby the amount of reverberation in the diffuse sound processing path is adjustable using the variable reverberation amount parameter.

4. The method of claim 1, comprising, in the diffuse sound processing path, prior to said applying the power 360 degree head related transfer function and said applying the first reverberation and the second reverberation:

converting the combined left channel and combined right channel to a sum and difference;

adjusting gain of the difference; and converting back from sum and difference into the combined left channel and combined right channel.

5. A method of processing multiple surround audio channels to produce left and right rendering channels for output to a stereo pair of loudspeakers, wherein the multiple surround audio channels comprise at least left and right channels, the method comprising:

processing the left and right channels in a direct sound processing path;

processing the left and right channels in a diffuse sound processing path, in the direct sound processing path:

applying a power 360 degree head related transfer function associated with listener diffuse sound field response;

performing a first sum and difference of the left and right channels;

applying a near front head related transfer function to the difference of the left and right channels, wherein the near front head related transfer function relates to response to a near front sound source; and performing a second sum and difference of the sum and difference of the left and right channels.

6. The method of claim 5 wherein the multiple surround audio channels further comprise a center channel, and the method further comprises further processing the center channel in the diffuse sound processing path.

7. The method of claim 5 wherein the multiple surround audio channels further comprise left rear and right rear channels, and the method further comprises processing the left and right rear channels in a rear channels processing path.

8. A method of processing multiple surround audio channels to produce left and right rendering channels for output to a stereo pair of loudspeakers, wherein the multiple surround audio channels comprise at least left and right channels and left rear and right rear channels, the method comprising:

processing the left and right channels in a direct sound processing path;

processing the left and right channels in a diffuse sound processing path;

in the diffuse sound processing path, applying a power 360 degree head related transfer function associated with listener diffuse sound field response;

processing the left rear and right rear channels in a rear channels processing path;

in the rear channels processing path:

performing a first sum and difference of the left rear and right rear channels;

applying a far back head related transfer function to the sum of the left rear and right rear channels, wherein the far back head related transfer function relates to response to a sound source at far back of the listener; and applying a near back head related transfer function to the difference of the left rear and right rear channels, wherein the near back head related transfer function related to frequency response to a sound source at near back of the listener; and performing a second sum and difference of the sum and difference of the left rear and right rear channels.

9. The method of claim 8, comprising, in the rear channels processing path, filtering the left rear and right rear channels with a normalizing filter.

10. A method of processing multiple surround audio channels to produce left and right rendering channels for output to a stereo pair of loudspeakers, wherein the multiple surround audio channels comprise at least left and right channels and left rear and right rear channels, the method comprising:

processing the left and right channels in a direct sound processing path;

processing the left and right channels in a diffuse sound processing path;

in the diffuse sound processing path, applying a power 360 degree head related transfer function associated with listener diffuse sound field response;

processing the left rear and right rear channels in a rear channels processing path;

combining a left channel from each of the direct sound processing path, rear channels processing path and diffuse sound processing path to produce the left rendering channel;

combining a right channel from each of the direct sound processing path, rear channels processing path and diffuse sound processing path to produce the right rendering channel; and scaling the left and right channels from the diffuse sound processing path to be combined into the left and right rendering channels by a factor of a diffuse path gain parameter.

11. A speaker virtualization system for output of left and right rendering channels to a stereo pair of loudspeakers from a multiple surround audio channels source, wherein the multiple surround audio channels comprise at least left and right channels, the speaker virtualization system comprising:

inputs for the multiple surround audio channels;

an audio signal processor having a front channels signal processing path for processing the left and right channels, and a diffuse sound processing path for processing the multiple surround audio channels;

left and right rendering channel outputs;

wherein the diffuse sound processing path comprises:

a power 360 degree head related transfer function associated with listener diffuse sound field response;

a left channels summing node for combining left and left rear channels into a combined left channel;

a right channels summing node for combining right and right rear channels into a combined right channel;

a left reverberation stage for applying a first reverberation to the combined left channel; and a right reverberation stage for applying a second reverberation to the combined right channel, wherein the second reverberation differs from the first reverberation, and wherein the first and second reverberation are scaled according to a variable reverberation amount parameter.

12. The speaker virtualization system of claim 11 wherein the diffuse sound processing path comprises, prior to said applying the power 360 degree head related transfer function and said applying the first reverberation and the second reverberation::

a first conversion stage for converting the combined left channel and combined right channel to a sum and difference;

a variable gain for adjusting gain of the difference; and a second conversion stage for converting back from sum and difference into the combined left channel and combined right channel.

13. A speaker virtualization system for output of left and right rendering channels to a stereo pair of loudspeakers from a multiple surround audio channels source, wherein the multiple surround audio channels comprise at least left and right channels, the speaker virtualization system comprising:

inputs for the multiple surround audio channels;

an audio signal processor having a front channels signal processing path for processing the left and right channels, and a diffuse sound processing path for processing the multiple surround audio channels;

left and right rendering channel outputs;

wherein the diffuse sound processing path comprises a power 360 degree head related transfer function associated with listener diffuse sound field response;

wherein the front channels processing path comprises:

a first sum and difference stage for producing a sum and difference of the left and right channels;

a near front head related transfer function applied to the difference of the left and right channels, wherein the near front head related transfer function relates to response to a near front sound source; and a second sum and difference stage for combining the sum and difference of the left and right channels back into left and right channels.

14. The speaker virtualization system of claim 13 wherein the front channels processing path further comprises:

a left summing node for combining the left channel with a delayed version of the right channel; and a right summing node for combining the right channel with a delayed version of the left channel.

15. A speaker virtualization system for output of left and right rendering channels to a stereo pair of loudspeakers from a multiple surround audio channels source, wherein the multiple surround audio channels comprise at least left and right channels, the speaker virtualization system comprising:

inputs for the multiple surround audio channels;

an audio signal processor having a front channels signal processing path for processing the left and right channels, and a diffuse sound processing path for processing the multiple surround audio channels; and left and right rendering channel outputs;

wherein the diffuse sound processing path comprises a power 360 degree head related transfer function associated with listener diffuse sound field response;

wherein the multiple surround audio channels further comprise a left rear channel and a right rear channel, and wherein the audio signal processor also has a rear channels processing path that comprises:

a first sum and difference stage for producing a sum and difference of the left rear and right rear channels;

a far back head related transfer function applied to the sum of the left rear and right rear channels, wherein the far back head related transfer function relates to response to a sound source at far back of the listener; and a near back head related transfer function applied to the difference of the left rear and right rear channels, wherein the near back head related transfer function related to frequency response to a sound source at near back of the listener; and a second sum and difference stage for combining the sum and difference of the left rear and right rear channels back into left rear and right rear channels.

16. The speaker virtualization system of claim 15 wherein the rear channels processing path comprises a left normalizing filter and right normalizing filter applied respectively to the left rear and right rear channels.

17. A speaker virtualization system for output of left and right rendering channels to a stereo pair of loudspeakers from a multiple surround audio channels source, wherein the multiple surround audio channels comprise at least left and right channels and a left rear channel and a right rear channel, the speaker virtualization system comprising:

inputs for the multiple surround audio channels;

left and right rendering channel outputs;

an audio signal processor having:

a front channels signal processing path for processing the left and right channels;

a diffuse sound processing path for processing the multiple surround audio channels and comprising a power 360 degree head related transfer function associated with listener diffuse sound field response;

a rear channels processing path;

a summing node for combining a left channel from each of the front channels processing path, rear channels processing path and diffuse sound processing path to produce the left rendering channel;

a summing node for combining a right channel from each of the front channels processing path, rear channels processing path and diffuse sound processing path to produce the right rendering channel; and a scaling of the combined left and combined right channels from the diffuse sound processing path by a factor of a diffuse path gain parameter before combination by the summing nodes into the left and right rendering channels.

18. A method of processing multiple surround audio channels to produce left and right rendering channels for output to a stereo pair of loudspeakers, wherein the multiple surround audio channels comprise at least left and right channels, the method comprising:

processing the left and right channels in a direct sound processing path;

processing the left and right channels in a diffuse sound processing path;

in the diffuse sound processing path, applying a power 360 degree head related transfer function associated with listener diffuse sound field response;

scaling the left and right channels processed in the direct sound processing path according to a gain in the diffuse sound processing path;

combining the scaled left channel processed in the direct sound processing path with the left channel processed in the diffuse sound processing path to produce a left output channel; and combining the scaled right channel processed in the direct sound processing path with the right channel processed in the diffuse sound processing path to produce a right output channel.

19. The method of claim 18, comprising, in the direct sound processing path:

combining the left channel with a delayed version of the right channel; and combining the right channel with a delayed version of the left channel.

20. The method of claim 18 wherein the multiple surround audio channels further comprise a center channel, and the method further comprises:

processing the center channel with the left channel in the diffuse sound processing path; and processing the center channel with the right channel in the diffuse sound processing path.

21. The method of claim 18 wherein the multiple surround audio channels further comprise left rear and right rear channels, and the method further comprises:

processing the left rear and right rear channels in a rear channels processing path;

processing the left rear channel with the left channel in the diffuse sound processing path; and processing the right rear channel with the right channel in the diffuse sound processing path.

* * * * *